United States Patent [19]
Lee et al.

[11] Patent Number: 5,764,076
[45] Date of Patent: Jun. 9, 1998

[54] CIRCUIT FOR PARTIALLY REPROGRAMMING AN OPERATIONAL PROGRAMMABLE LOGIC DEVICE

[75] Inventors: Napoleon W. Lee, Milpitas; Derek R. Curd, San Jose; Jeffrey H. Seltzer, Los Gatos; Jeffrey Goldberg, San Jose; David Chiang, Saratoga; Kameswara K. Rao, San Jose; Nicholas Kucharewski, Jr., Pleasanton, all of Calif.

[73] Assignee: Xilinx, Inc., San Jose, Calif.

[21] Appl. No.: 670,472

[22] Filed: Jun. 26, 1996

[51] Int. Cl.[6] .................................................. H03K 19/177
[52] U.S. Cl. .................................. 326/38; 326/39; 326/40
[58] Field of Search .................................. 326/38–41, 47

[56] References Cited

U.S. PATENT DOCUMENTS

| | | | |
|---|---|---|---|
| 5,448,186 | 9/1995 | Kawata | 326/41 |
| 5,550,782 | 8/1996 | Cliff et al. | 326/40 X |
| 5,623,217 | 4/1997 | Britton et al. | 326/40 |
| 5,654,650 | 8/1997 | Gissel | 326/39 X |

OTHER PUBLICATIONS

"The Programmable Logic Data Book", 1994, pp. 3–2 through 3–90, available from Xilinx, Inc., 2100 Logic Drive, San Jose, CA 95124.

*Primary Examiner*—David R. Hudspeth
*Attorney, Agent, or Firm*—Arthur J. Behiel; Jeanette S. Harms

[57] ABSTRACT

A complex programmable logic device (PLD) that includes a number of programmable function blocks and an instruction bus for receiving programming instructions. The programming instructions are used to program the function blocks to enable the PLD to perform one or more desired logic functions. The PLD also includes an instruction-blocking circuit that is connected to each of the functional blocks. When directed by a user, the instruction blocking circuit selectively blocks programming instructions on the instruction bus from one or more of the function blocks while allowing the other function blocks to receive the programming instructions. Thus, one or more function blocks in the PLD are reprogrammed without interrupting the operation of the remaining function blocks.

9 Claims, 3 Drawing Sheets

CIRCUIT FOR PARTIALLY REPROGRAMMING AN OPERATIONAL PROGRAMMABLE LOGIC DEVICE

BACKGROUND OF THE INVENTION

1. Field of the Invention

This invention relates generally to programmable logic devices (PLDs), and in particular to complex, in-system programmable PLDs.

2. Description of Related Art

PLDs are a well-known type of programmable integrated circuit that includes an array of identical function blocks connected via a universal interconnect matrix (UIM). Input signals are transmitted to the UIM from device input pins, and are routed by the UIM to the function blocks. Each function block includes an AND array and a number of macrocells.

Within each function block, the AND array receives the input signals from the UIM and provides product terms to the macrocells, each including an OR gate that produces an output signal based on selected product terms from the AND array. The output signals generated by the macrocells are then either fed back to the UIM for further processing or transmitted to an output pin of the PLD as an output signal. PLDs that include the above-described circuit structure are described in more detail in Section 3, pages 3-2 to 3-90, of *The Programmable Logic Data Book* (1994) published by Xilinx, which is incorporated herein by reference.

The function blocks and UIM may be programmed to provide logic functions desired by a "user" (e.g., a circuit designer). To accomplish such programming, each function block and the UIM includes an array of programmable memory cells, such as flash transistor storage cells, that may be programmed to specify a desired function. Individual function blocks can be programmed to provide distinct logic functions, or the function blocks and UIM may be collectively programmed to provide more complex logic functions.

It is known to reprogram a PLD "in-system," that is, while the PLD is installed on a printed circuit board. However, while the PLD need not be physically removed, conventional in-system reprogramming requires that the PLD operation be suspended during the reprogramming process. Unfortunately, this necessary suspension may cause problems when the PLD is a component of a system that cannot afford even a temporary cessation of operation, as when the PLD is maintaining a communications link or providing essential clock signals. For the foregoing reasons, there is a need for a PLD that can be reprogrammed without interrupting essential operations being provided by the PLD.

SUMMARY OF THE INVENTION

The present invention is directed to a PLD that may be reprogrammed without interrupting essential operations being provided by the PLD. The inventive PLD includes a number of programmable functional units connected to an instruction bus configured to receive externally supplied programming instructions. By issuing such programming instructions, a user programs one or more of the functional units to perform specific logic functions.

In accordance with the present invention, the PLD also includes instruction-blocking circuitry to selectively block incoming programming instructions from affecting one or more of the functional units while allowing the remaining functional units to respond to the instructions. Thus, one or more functional units may be reprogrammed without interrupting the operation of the remaining functional units of the PLD. Also in accordance with the present invention, a user can implement essential logic functions in one or more functional units, leaving the remaining functional units for e.g. less essential logic functions. Then, if the user wishes to reprogram one of the less essential logic functions without interrupting any of the essential logic functions, the instruction blocking circuit is used to block programming instructions to the functional units containing the essential logic while the remaining functional units are reprogrammed. The present invention thus satisfies the need for a PLD that is reprogrammed without interrupting essential logic functions.

BRIEF DESCRIPTION OF THE FIGURES

These and other features, aspects, and advantages of the present invention will become understood with regard to the following description, appended claims, and accompanying drawings, where:

DETAILED DESCRIPTION OF THE DRAWINGS

Figure 1:
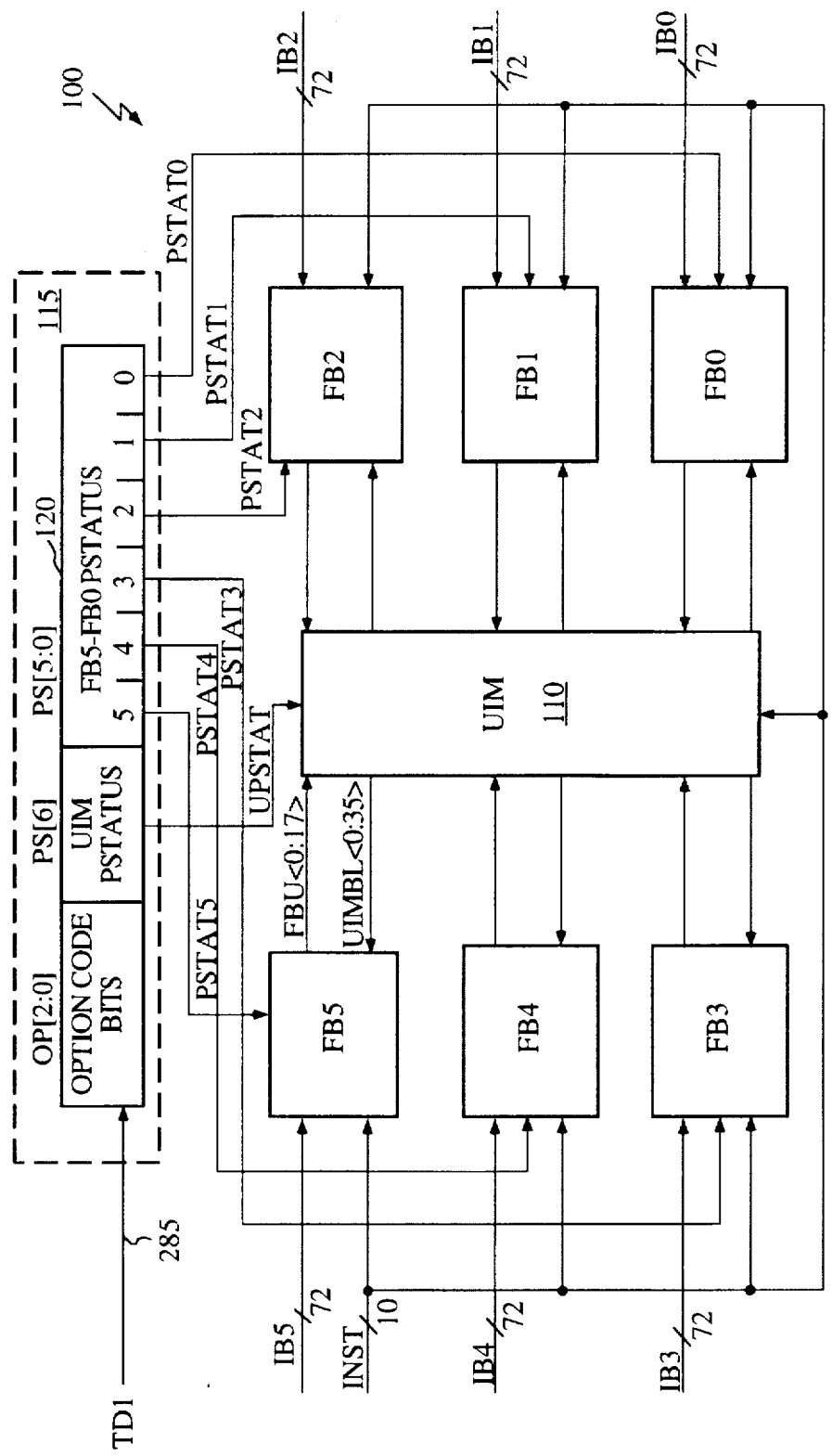
FIG. 1 is a block diagram of a complex PLD 100 in accordance with the present invention.

FIG. 1 is a block diagram of a complex PLD 100 in accordance with the present invention. PLD 100 includes an array of six identical function blocks FB0–FB5 connected to one another via a universal interconnect matrix (UIM) 110. Each of function blocks FB0–FB5 and UIM 110 includes an array of flash-transistor storage cells that may be programmed to specify a desired function. For this reason, the term "functional unit" is used to refer both to function blocks FB0–FB5 and to UIM 110. PLD 100 also includes JTAG test circuitry 115.

PLD 100 supports in-system programming features and instructions. As is well known to those in the art, "in-system programming" (hereafter ISP) refers to the entire process of programming a PLD in-system, and therefore encompasses the actions of e.g. erasing, programming, and verifying the states of the flash-transistor storage cells. In accordance with the present invention, JTAG test circuitry 115 includes an ISP-enable register 120 to support ISP.

Each of the six identical function blocks FB0–FB5 has 72 input nodes (36 input nodes and their complements) on their respective input buses IB0–IB5. A ten-line instruction bus INST, shared by each of the functional units, is coupled to test control circuitry (not shown), which provides commands for e.g. programming, erasing, and verifying the states of the programmable memory cells within each of the functional units. For a detailed explanation of various commands associated with the test control circuitry, see the commonly owned U.S. Pat. No. 5,563,827 issued Oct. 8, 1996 entitled "Wordline Driver For Flash PLD," by Napoleon W. Lee, Derek R. Curd, Wei-Yi Ku, Sholeh Diba, and George Simmons, which is incorporated herein by reference.

UIM 110 receives 108 input lines, 18 from each function block, on e.g. bus FBU<0:17>, and drives 36 output lines to each of function blocks FB0–FB5 on e.g. bus UIMBL<0:35> specific to function block FB5. The connections for the remaining function blocks FB0–FB4 are similar and are therefore unlabeled for simplicity.

JTAG test circuitry 115 is conventionally used to verify the integrity of printed circuit board traces between PLD 100 and other chips on an assembled printed circuit board that have compatible JTAG test circuitry. To provide the necessary compatibility, JTAG test circuitry 115 is fully compliant with the IEEE Standard 1149.1 Test Access Port and Boundary-Scan Architecture, commonly referred to as the "JTAG standard," or simply "JTAG." That is, test circuitry 115 supports a set of mandatory "public" instructions that all vendors claiming conformance to IEEE Std. 1149.1 must support. JTAG is an acronym for the Joint Test Action Group, the technical subcommittee that developed the JTAG standard.

In addition to the mandatory public instructions, JTAG test circuitry 115 also supports some optional public instructions defined by the JTAG standard. Such optional instructions provide for e.g. isolating a single chip in a circuit board to test that chip. JTAG test circuitry 115 is explained in more detail in connection with FIG. 2.

ISP-enable register 120 includes ten program-status (PSTATUS) flip flops that collectively store three option code bits OP[2:0], a UIM program-status bit PS[6], and six function block program-status bits PS[5:0]. Each flip flop storing a program-status bit drives an output line (UPSTAT and PSTAT0–PSTAT5) that connects to a corresponding one of UIM 110 and function blocks FB0–FB5. Because ISP-enable register 120 cooperates with each of function blocks FB0–FB5 in substantially the same way, the following discussion focuses on a single function block, function block FB5, and on UIM 110.

When a programmable memory cell, including those within each functional unit, is either programmed or erased, a program-verify or an erase-verify test is generally performed to verify the resultant state (i.e., programmed or erased) of the affected memory cell. One step of the verification process includes applying a verify voltage to the memory cell under test, the level of the verify voltage depending on whether the test being performed is a program-verify or an erase-verify test. Option code bits OP[2:0] enable PLD 100 to provide the appropriate verify voltage for a given verify instruction. For a more detailed explanation of how the states of memory cells are verified, see the commonly owned U.S. Pat. No. 5,563,827, entitled "Wordline Driver for Flash PLD."

Figure 2:
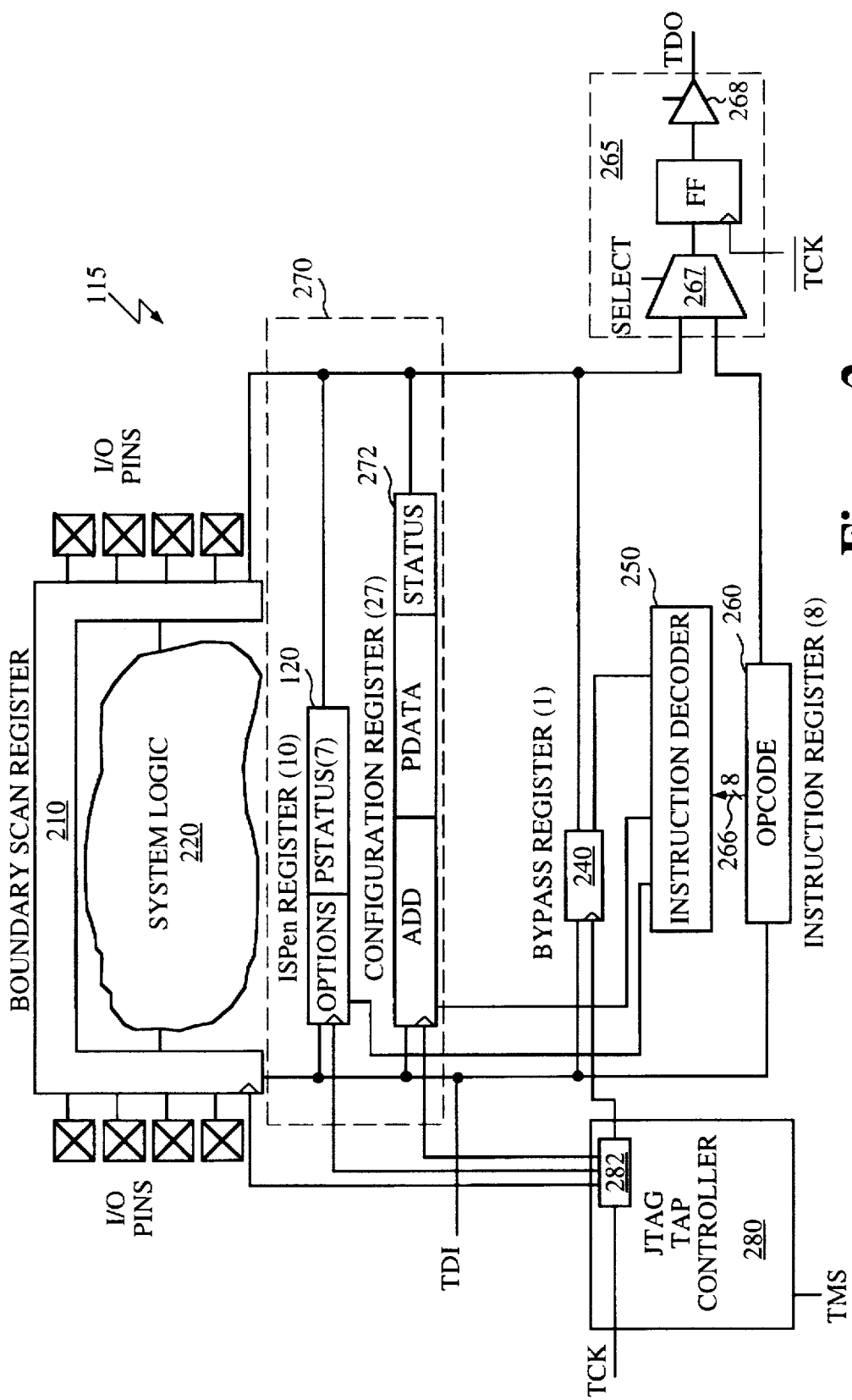
FIG. 2 is a block diagram of JTAG test circuitry 115.

In accordance with the present invention, PSTATUS bits PS[6:0] are used to selectively reprogram one or more functional units while allowing the remaining functional units to remain operational (i.e., to remain in the "active mode"). The states (e.g., logic zero or logic one) of PSTATUS bits PS[6:0] determine which of the functional units are left active and which are reprogrammed. For example, to reprogram function block FB5 without interrupting the operation of the remaining functional units (i.e., allowing FB0–FB4 and UIM 110 to remain in the active mode), PSTATUS bits PS[6:0] are configured to block any programming instructions on instruction bus INST to all but function block FB5. FIG. 2 is a block diagram showing detail of JTAG test circuitry 115. To support all mandatory instructions and features defined by the JTAG standard, JTAG test circuitry 115 includes the following conventional JTAG components: a boundary-scan register 210, system logic 220, a bypass register 240, an instruction decoder 250, an instruction register 260, an output circuit 265, and a JTAG test-access port (TAP) controller 280. In accordance with the present invention, JTAG test circuitry 115 also includes ISP circuitry 270, which in turn includes ISP-enable register 120 of FIG. 1 and a configuration register 272, both of which are defined in accordance with the JTAG standard under guidelines for additional JTAG data registers. For a detailed discussion of these JTAG components, see the commonly owned U.S. patent application entitled "Efficient In-System Programming Structure and Method for Non-Volatile Programmable Logic Devices," by Derek R. Curd, Kameswara K. Rao, and Napoleon W. Lee, Ser. No. 08/512,796, filed 9 Aug. 1995 (attorney docket number X-184), incorporated herein by reference.

System logic 220 (not shown here in detail) provides a conventional interface between JTAG circuitry 115 and a plurality of input/output (I/O) pins. System logic 220 is selectively connected through boundary-scan register 210 to input/output pins I/O, and is configured such that signals from either of system logic 220 or boundary-scan register 210 drive the I/O pins. A detailed description of the interface between the I/O pins and JTAG test circuitry 115 is omitted because this interface is well known in the art.

TAP controller 280 is a sixteen-state finite state machine that controls the scanning of data into the various registers of JTAG architecture 115 in accordance with the JTAG standard. TAP controller 280 includes four terminals, TDI, TDO, TMS, and TCK, that make up the test access port. Terminal TDI, the serial input terminal to PLD 100, provides signals to an ISP-enable register 120, a bypass register 240, an instruction register 260, and a configuration register 272. Terminal TMS provides signals to control the state transitions of TAP controller 280, whereas terminal TCK provides clock signals to a multiplexer 282 within TAP controller 280. Depending on the state of TAP controller 280, a local clock signal derived from the clock signal on terminal TCK clocks a selected one of ISP-enable register 120, boundary scan register 210, bypass register 240, instruction register 260, or configuration register 272, all of which are tri-statable serial-shift registers. Thus configured, the contents of any of registers 120, 240, 260, and 272 can be serially shifted into, for example, a similar register of a second JTAG-compatible complex PLD on the same circuit board as complex PLD 100.

Terminal TDO is the serial output terminal of PLD 100, and is driven by an output circuit 265, which includes a multiplexer 267, a flip flop FF, and a tri-statable driver 268. Multiplexer 267 is controlled, via a Select terminal, by TAP controller 280 in accordance with the JTAG standard to select an output of either instruction register 260 or one of the data registers. Also in accordance with the JTAG standard, flip flop FF causes output terminal TDO to change state on the falling edge of clock signal TCK, and output terminal TDO may be tri-stated by tri-statable driver 268. The tri-state terminal of driver 268 is controlled such that the signal on terminal TDO is only active during the shifting of data through JTAG architecture 115; terminal TDO is tri-stated at all other times.

In one embodiment, the terminals of the test access port (TDI, TDO, TCK, and TMS) also serve as input/output terminals, depending on the state of a programmable JTAG-disable bit (not shown). When the JTAG-disable bit is a logic zero, output buffers (not shown) that drive the four test access port terminals allow TAP controller 280 and the various JTAG registers to respond to signals on the JTAG terminals. If, on the other hand, the JTAG-disable bit is a logic one, then JTAG architecture 115 is completely disabled (e.g., TAP controller 280 is forced into a permanent reset state). For a detailed discussion of the JTAG-disable bit and associated circuitry, see the copending application entitled "Reset Circuit For a Programmable Logic Device," by Ronald J. Mack, Derek R. Curd, Sholeh Diba, Napoleon W. Lee, Kameswara K. Rao, and Mihai G. Statovici, Ser. No. 08/670,916, filed herewith, which is incorporated herein by reference.

Instruction register 260 has eight bits, IR[7:0], and is connected between terminal TDI and terminal TDO. An eight-bit parallel output bus 266 from instruction register 260 feeds instruction decoder 250, which decodes instructions (i.e., "OPCODES") stored within instruction register 260. The output signals of instruction decoder 250 then conventionally determine which of the JTAG registers between terminal TDI and terminal TDO are selected for a given instruction.

Bypass register 240 is a one-stage shift register connected between terminal TDI and terminal TDO. If no JTAG function is desired for PLD 100, bypass register 240 allows PLD 100 to be "bypassed" from a serial JTAG chain of many JTAG-compatible components by passing data from terminal TDI to terminal TDO without affecting the operation of PLD 100.

As discussed above, JTAG architecture 115 supports ISP with ISP circuitry 270, including ISP-enable register 120 and a configuration register 272. Also included to support ISP are the additional instructions ISP-enable (ISPEN), in-system program (IPGM), in-system verify (IVFY), in-system erase (IERASE), and configuration load (CONLD), which were added to the JTAG instruction set. These ISP instructions are not specified in the JTAG standard, but are fully compliant with JTAG standard rules for adding additional instructions.

ISP-enable register 120 is active when an in-system-program-enable (ISPen) instruction is loaded into instruction register 260. An ISPen instruction loaded into instruction register 260 causes instruction decoder 250 to select ISP-enable register 120, thereby allowing ISP-enable register 120 to receive a serially input program-status instruction from terminal TDI. The program-status instruction prepares PLD 100 for either complete or partial reprogramming. The degree of reprogramming is determined by the values of the PSTATUS bits PS[6:0] stored in ISP-enable register 120, as discussed above in connection with FIG. 1.

Configuration register 272 includes an address field ADD, a program-data field PDATA, and a status field STATUS. If any of ISP instructions IPGM, IVFY, or IERASE is entered into instruction register 260, then configuration register 272 is selected and data entered to terminal TDI are passed through configuration register 272 to output terminal TDO. Instruction decoder 250 decodes the instruction bits in instruction register 260 and provides control/enable signals to configuration register 272.

Figure 3:
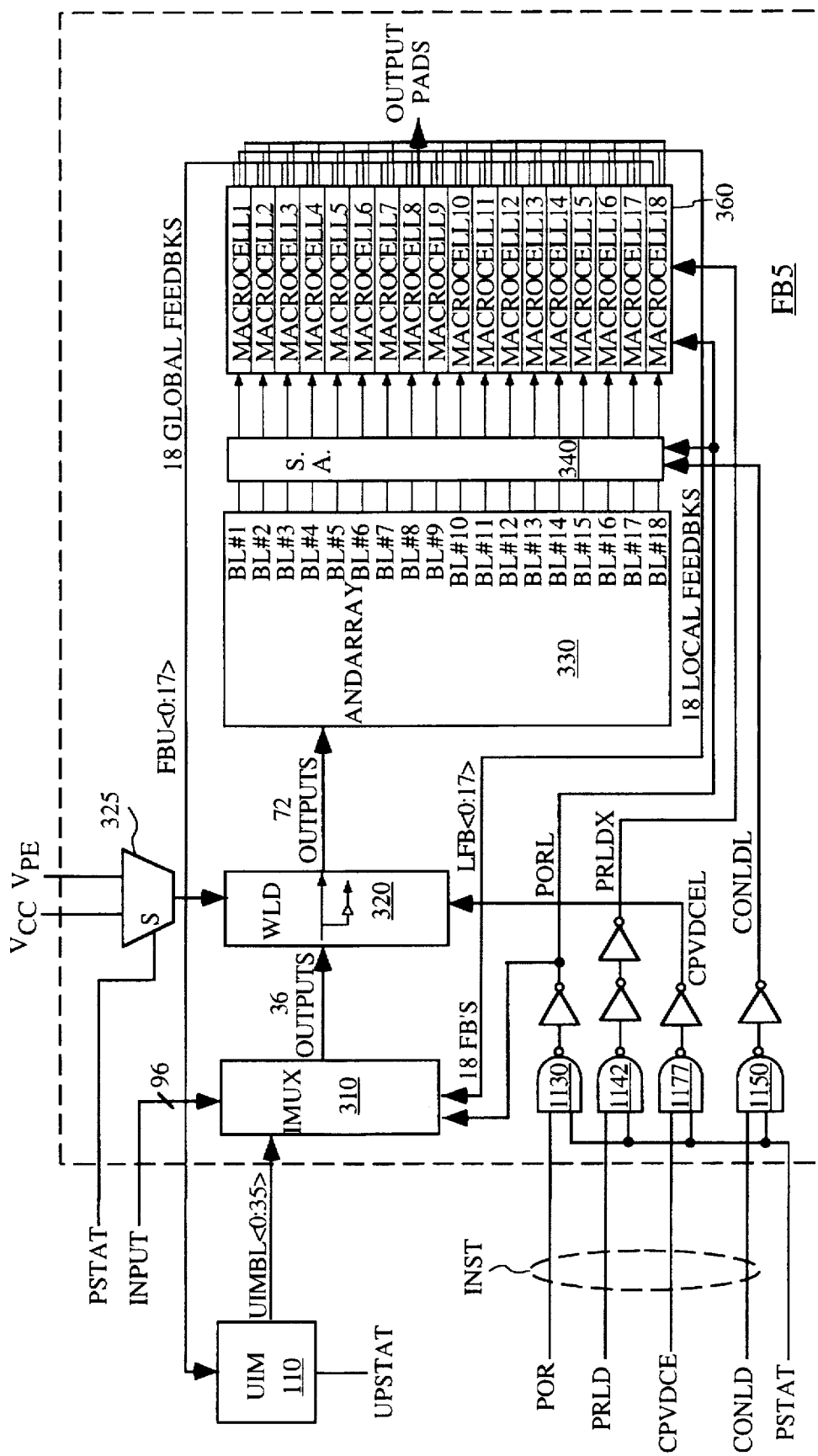
FIG. 3 is a block diagram of function block FB5.

FIG. 3 is a block diagram of a function block such as FB5 of FIG. 1. Each function block includes an input multiplexer (IMUX) 310, a wordline driver 320, a multiplexer 325, an AND array 330, a sense-amplifier array 340, and a macrocell block 360. In accordance with the present invention, each function block, including function block FB5, also includes NAND gates 1130, 1142, 1150, and 1177. These NAND gates logically combine a power-on-reset signal on line POR, the signal on preload line PRLD, the signal on configuration-load line CONLD, and the signal on conload/program-verify/DC-erase line CPVDCE with the signal on program-status line PSTAT. NAND gates 1130, 1142, 1150, and 1177 operate as switches that allow command signals on lines POR, PRLD, CONLD, and CPVDCE to pass on to various components of function block FB5 when the signal on node PSTAT is a logic one, and block those command signals when the signal on node PSTAT is a logic zero. Thus, ISP-enable register 120 and NAND gates 1130, 1142, 1150, and 1177 collectively operate as an instruction-blocking circuit that allows selected ones of the functional units to ignore programming instructions and remain in the active mode.

Of course, other logic elements may be used to selectively block the command signals. For example, multiplexers within each function block could be used to provide the logic provided in FIG. 3 by NAND gates 1130, 1142, 1150, and 1177, or a single complex multiplexer could provide the necessary instruction-blocking logic for all of function blocks FB0–FB5 and UIM 110.

Configuration bit latches (not shown) associated with AND array 330 conventionally store configuration information that determines the logic functions provided by function blocks FB0–FB5 and UIM 110. In the configuration-load ("conload") mode, immediately after PLD 100 is reset, configuration information is programmed into the programmable memory cells, and is then automatically loaded into the configuration bit latches. Once PLD 100 is fully configured and initialized, PLD 100 enters the active mode.

IMUX 310 has 151 input nodes and 36 output nodes, the output nodes providing a multiplexed combination of input signals from input bus 96, local feedback bus LFB<0:17>, and global feedback bus UIMBL<0:35> from UIM 110. Programmable memory cells associated with IMUX 310 determine which of the input signals are provided as outputs.

AND array 330 is an array of memory cells that are configured to form a programmable array of AND gates. These AND gates may be programmed to provide selected logic functions. For a more detailed explanation of the operation of an AND array in accordance with one embodiment of the present invention, see the above-cited application entitled "Wordline Driver for Flash PLD."

Sense-amplifier array 340 is an array of eighteen sense amplifiers, each of which receives an input signal from a corresponding one of bit lines BL#1–BL#18 from AND array 330. Sense-amplifier array 340 amplifies the voltage levels on bit lines BL#1–BL#18 to provide logic output signals having logic levels of zero volts and $V_{cc}$ (e.g., five volts) to macrocell block 360.

Programmable AND array 330 generates a large number of product terms that are provided via bit lines BL#1–BL#18 and sense-amplifier array 340 to the macrocells in each block. The eighteen macrocells of macrocell block 360 are each identical prior to programming, after which they each may be configured to function as e.g. a flip-flop.

Referring to FIG. 2, when an ISP-enable instruction is loaded from terminal TDI into instruction register 260, instruction decoder 250 enables ISP-enable register 120 to accept data received on terminal TDI. This data, the program-status data, determines the values stored in PSTATUS bits PS[6:0], and consequently determines which of the functional units are affected by subsequent programming commands. The program-enable must be the first instruction executed during any in-system programming cycle because the other ISP instructions (e.g. program, erase, or configuration load) cannot execute without first selecting which functional units are to respond to those instructions.

After the program-status instruction is loaded into ISP-enable register 120, a logic one stored in a particular one of PSTATUS bits PS[6:0] enables the functional unit associated with that PSTATUS bit to receive programming instructions over instruction bus INST. Conversely, a logic zero blocks incoming programming instructions on instruction bus INST so that the corresponding functional unit will remain in the active mode. If the PSTATUS bits are not overwritten by a program-status instruction, ISP-enable register 120 outputs a default logic one for each PSTATUS bit, resulting in a reprogramming of all functional units.

In FIG. 3, the PSTATUS bit PS[5] associated with function block FB5 determines the logic level on program-status line PSTAT5. If, for example, a partial reprogramming sequence is initiated to reprogram only function block FB5, then the PSTATUS bit PS[5] is set to one, causing the signal on line PSTAT5 to be a logic one. In such a case, NAND gates 1130, 1142, 1150, and 1177 allow the respective signals on lines POR, PRLD, CPVDCE, and CONLD to act on function block FB5. If, on the other hand, a partial reprogram is initiated that is not to effect function block FB5, then the PSTATUS bit PS[5] is set to a logic zero, causing the signal on line PSTAT5 to be a logic zero; consequently, NAND gates 1130, 1142, 1150, and 1177 block the signals on lines POR, PRLD, CPVDCE, and CONLD so that function block FB5 is unaffected by the signals on those lines. Other NAND gates, not shown in FIG. 3, selectively allow or block a number of other command signals associated with programming one or more of function blocks FB0–FB5 and UIM 110 as will be understood from the foregoing.

Power MUX 325 alternately supplies wordline driver 320 with the voltage level on node $V_{cc}$ or the voltage level on node $V_{pe}$. The voltage on node $V_{cc}$, typically 5 volts, supplies power to wordline driver 320 in the active mode. However, the flash memory cells within function block FB5 require a higher voltage (e.g., 12 volts) for programming and erasing. Thus, power MUX 325 is connected to node PSTAT5 and configured such that when PSTAT5 is a logic one (indicating that function block FB5 is to be reprogrammed) the program or erase voltage on node $V_{pe}$ is connected to wordline driver 320, and when PSTAT5 is a logic zero (indicating that function block FB5 is to remain in the active mode) the voltage on node $V_{cc}$ is connected to wordline driver 320. A similar power multiplexer (not shown) within UIM 110 performs the same function as power MUX 325, and is switched by the logic level on node UPSTAT.

It is important to note that PLD 100 may be programmed so that a given functional unit relies upon input signals from other of the functional units. For example, function block FB5 may receive feedback signals from UIM 110. In such cases, attempting to reprogram a functional unit upon which an active functional unit depends can result in an error. Therefore, in one embodiment distinct logic functions are programmed in separate function blocks.

For example, PLD 100 may be programmed so that function block FB5 provides the combinatorial logic necessary for a counter circuit and function block FB4 provides the combinatorial logic necessary for a clock divider circuit. Then, assuming that the counter circuit of function block FB5 does not rely on input signals from function block FB4, function block FB4 can be reconfigured without interrupting the operation of the counter circuit of function block FB5.

Although the present invention has been described in considerable detail with reference to certain versions thereof, other versions are possible. For example, an embodiment of the invention could include a plurality of separate instruction buses for a plurality of functional units instead of a single, multiplexed instruction bus as described above. Hence, the scope of the appended claims is not limited to the description of the embodiments described herein.

We claim:

1. A programmable logic device comprising:

an instruction bus receiving programming instructions;

a first programmable function unit connected to the instruction bus;

a second programmable function unit connected to the instruction bus; and an instruction-blocking circuit connected to each of the first and second programmable function units, the blocking circuit selectively blocking programming instructions from the instruction bus to one of the first and second programmable function units.

2. The device of claim 1, wherein the instruction blocking circuit is a register connected to a command bus.

3. The device of claim 1, wherein the first programmable function unit is reprogrammable.

4. The device of claim 1, wherein the first programmable function unit is programmed to implement a first logic function and the second programmable function unit is programmed to implement a second logic function, and wherein the second programmable function unit is reprogrammable during a time that the first programmable function unit performs the first logic function.

5. The device of claim 1, wherein the blocking circuit comprises:

an input node connected to the instruction bus; and first and second output nodes connected to the first and second functional units, respectively.

6. The device of claim 5, wherein the input node is configured to receive a blocking instruction on the instruction bus, the blocking instruction indicating which of the first and second functional units responds to subsequent programming instruction on the instruction bus.

7. An integrated circuit comprising:

first and second programmable function units programmed to perform first and second logic functions, respectively; and means for reprogramming the first programmable function unit during a time that the second programmable function unit performs the second logic function.

8. The circuit of claim 7, further comprising means for reprogramming the second programmable function unit during a time that the first programmable function unit performs the first logic function.

9. A method of partially reprogramming a programmable logic device having first and second functional units, wherein the first and second functional units are programmed to implement first and second logic functions, respectively, the method comprising:

providing programming instructions to the programmable logic device; and blocking the instructions to the first functional unit so that the first functional unit does not respond to the instructions.

* * * * *